United States Patent
Tripsas et al.

[11] Patent Number: 6,034,395
[45] Date of Patent: Mar. 7, 2000

[54] SEMICONDUCTOR DEVICE HAVING A REDUCED HEIGHT FLOATING GATE

[75] Inventors: Nicholas H. Tripsas, San Jose; Effiong Ibok, Sunnyvale; Tuan Duc Pham, Santa Clara, all of Calif.

[73] Assignee: Advanced Micro Devices, Inc., Sunnyvale, Calif.

[21] Appl. No.: 09/092,352

[22] Filed: Jun. 5, 1998

[51] Int. Cl.[7] .................................................. H01L 29/788
[52] U.S. Cl. ........................ 257/316; 257/314; 257/315; 257/316; 257/386; 257/387; 257/389; 438/257; 438/259; 438/262
[58] Field of Search ................................... 257/261, 377, 257/382, 314, 315, 316, 386, 387, 389; 438/257, 259, 262

[56] References Cited

U.S. PATENT DOCUMENTS

| | | | |
|---|---|---|---|
| 5,497,018 | 3/1996 | Kajita | 257/316 |
| 5,545,906 | 8/1996 | Ogura et al. | 257/315 |
| 5,604,366 | 2/1997 | Lee | 257/316 |
| 5,650,649 | 7/1997 | Tsukiji | 257/316 |
| 5,652,448 | 7/1997 | Chang et al. | 257/315 |
| 5,780,891 | 7/1998 | Kauffman et al. | 257/316 |
| 5,859,454 | 1/1999 | Choi et al. | 257/316 |
| 5,886,924 | 3/1999 | Kim et al. | 365/185.11 |
| 5,889,305 | 3/1999 | Choi et al. | 257/324 |
| 5,894,147 | 4/1999 | Cacharelis | 257/316 |
| 5,907,171 | 5/1999 | Santin et al. | 257/315 |

FOREIGN PATENT DOCUMENTS

| | | | |
|---|---|---|---|
| 004200620 A1 | 7/1993 | European Pat. Off. | 257/315 |
| 405110107 | 4/1993 | Japan | 257/315 |
| 406021472 | 1/1994 | Japan | 257/315 |
| 406163921 | 1/1994 | Japan | 257/315 |

*Primary Examiner*—Mahshid Saadat
*Assistant Examiner*—Edgardo Ortiz

[57] ABSTRACT

Arrangements are provided to increase the process control during the fabrication of the floating/control gate configuration in a non-volatile memory semiconductor device. The arrangements effectively reduce the severity of the topology attributable to the space between adjacent floating gates by advantageously reducing the height of the floating gates in particular locations. The reduced height floating gate's topology allows a subsequently formed control gate to be formed without significant surface depressions. Significant surface depressions in the control gate can lead to cracks in the silicide layer that is formed on the control gate. The cracking usually occurs during subsequent thermal processing of the semiconductor device. Thus the disclosed arrangements prevent cracking of the silicide layer on the control gate, which can affect the performance of the semiconductor device by increasing the resistance of the control gate arrangement.

9 Claims, 6 Drawing Sheets

SEMICONDUCTOR DEVICE HAVING A REDUCED HEIGHT FLOATING GATE

TECHNICAL FIELD

The present invention relates to semiconductor devices and manufacturing processes, and more particularly to methods and arrangements associated with non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as a oxide-nitride-oxide (ONO) layer.

The continued shrinking of the memory cells, and in particular the features depicted in the memory cells of FIGS. 1a–b, places a burden on the fabrication process to deposit/form the floating gate 16 and control gate 26 without creating deleterious effects within the memory cell. Of particular concern, caused by the shrinking dimensions, is the need to provide adequate isolation between each of the floating gates 16a–c, and between each of the floating gates 16a–c and control gate 26, while also providing an adequately arranged floating/control gate configuration. For example, one of the problems that has been encountered with reduced-size semiconductor devices is the tendency for deleterious cracks to form within control gate structures that employ silicide layer 28.

SUMMARY OF THE INVENTION

These needs and others are met by the present invention, which provides methods and arrangements that increase the process control during the fabrication of semiconductor devices, and in particular, during the formation of the floating/control gate configuration in a non-volatile memory semiconductor device.

In accordance with one aspect of the present invention, it has been found that in certain semiconductor arrangements, the topology created by the space between adjacent floating gates can be so severe in shape (e.g., deep and narrow) that the silicide layer formed on the overlying control gate often contains significant depressions over the space. These significant depressions can lead to cracks in the silicide layer during subsequent thermal processing of the semiconductor device, which tends to stress the silicide layer.

In accordance with one aspect of the present invention, the shape of the open spaces located between floating gates following patterning is altered by reducing the height of the floating gate near the openings. The resulting topology is, therefore, not as severe as it typically would be with a conventional floating gate having a significantly thicker floating gate near the openings. The modified topology improves the step coverage of both the control gate material and silicide material, and thereby does not cause significant depressions to form in the subsequently formed silicide layer. Consequently, cracking of silicide layer is substantially less likely to occur during the subsequent thermal processes. Additionally, the modified topology reduces the potential for electrically conductive stringers to be left behind during the subsequent patterning of the control gates.

Thus, in accordance with certain embodiments of the present invention, a semiconductor device is provided. The semiconductor device includes a substrate having a top surface, and at least two isolating regions, which are formed at least partially within the substrate, near the top surface of the substrate and separated from each other by an isolated region. The semiconductor device further includes a reduced height floating gate that is formed over the substrate and a portion of at least one of the isolating regions. The reduced height floating gate has a first thickness on the substrate and a second thickness on the isolating region. The first thickness is greater than the second thickness. In certain further embodiments, the semiconductor device also includes a dielectric layer that is conformally formed on the reduced height floating gate and at least a portion of each of the two isolating regions, a control gate formed on at least a portion of the dielectric layer and at least partially located directly over at least a portion of the reduced height floating gate, and a silicide formed on at least a portion of the control gate.

The above stated needs and others are also met by a method for fabricating a semiconductor device, in accordance with certain embodiments of the present invention. The method includes forming at least two isolating regions, separated by an isolated region, within a substrate, and forming an initial floating gate over the substrate and a portion of at least one of the isolating regions. The method then includes reducing the height of at least a portion of the initial floating gate to form a reduced height floating gate, wherein the reduced height floating gate has a first thickness over the substrate and a second thickness over the isolating regions, and wherein the first thickness is greater than the second thickness. In accordance with certain embodiments of the present invention, the step of reducing the height of at least a portion of the initial floating gate to form a reduced height floating gate includes forming a sacrificial layer on at least a portion of the initial floating gate, and then etching back portions of the sacrificial layer and portions of the initial floating gate. By way of example, in certain further embodiments the step of forming a sacrificial layer includes spinning-on a sacrificial layer of either a photoresist material, bottom anti-reflective material, and/or glass material, on at least a portion of the initial floating gate.

In accordance with still other embodiments of the present invention, a method for forming a reduced height floating gate in a non-volatile memory device is provided. The method includes forming a layer of polysilicon material on a tunnel oxide portion of a semiconductor device, selectively etching portions of the layer of polysilicon material to form an initial floating gate having a first thickness, and then reshaping the initial floating gate to form a reduced height floating gate by etching back at least a portion of the initial floating gate to a second thickness that is less than the first thickness. In certain further embodiments, the step of reshaping the initial floating gate includes applying a spin-on layer over the initial floating gate to protect specific regions of the initial floating gate, and then etching back less protected regions of the initial floating gate to form the reduced height floating gate.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
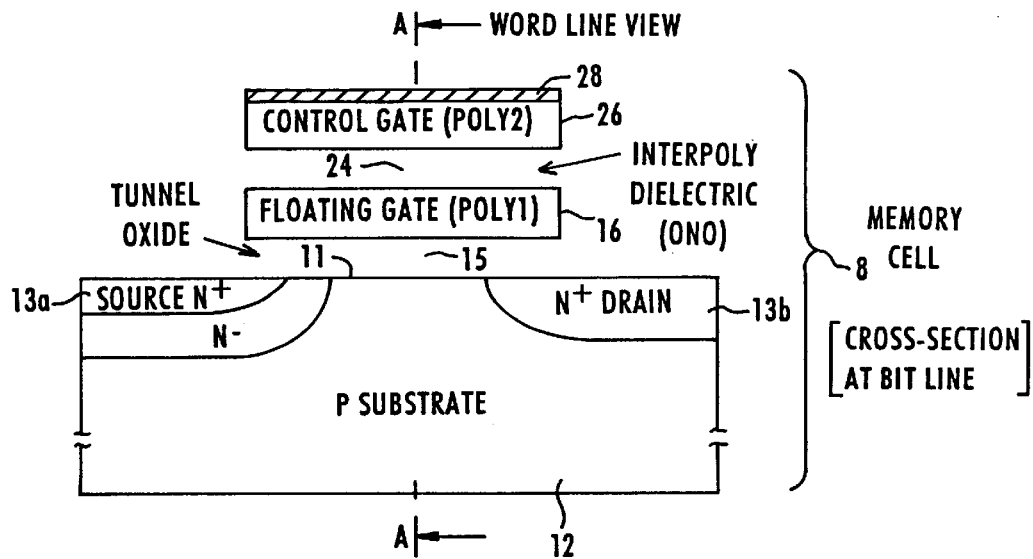
FIG. 1a depicts a cross-sectional view of a portion of a typical prior art semiconductor device having at least one memory cell, as viewed at the bit-line.
Figure 1B:
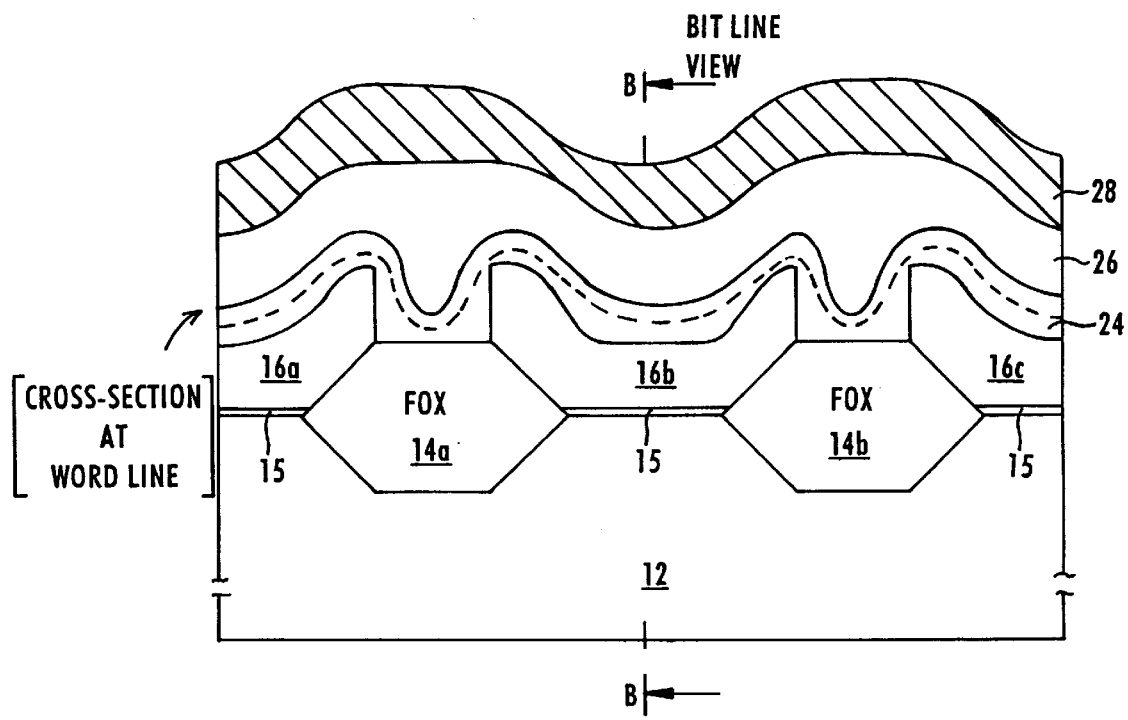
FIG. 1b depicts a cross-sectional view of a portion of a typical prior art semiconductor device, as in FIG. 1, having at least one memory cell, as viewed at the word-line.
Figure 2A:
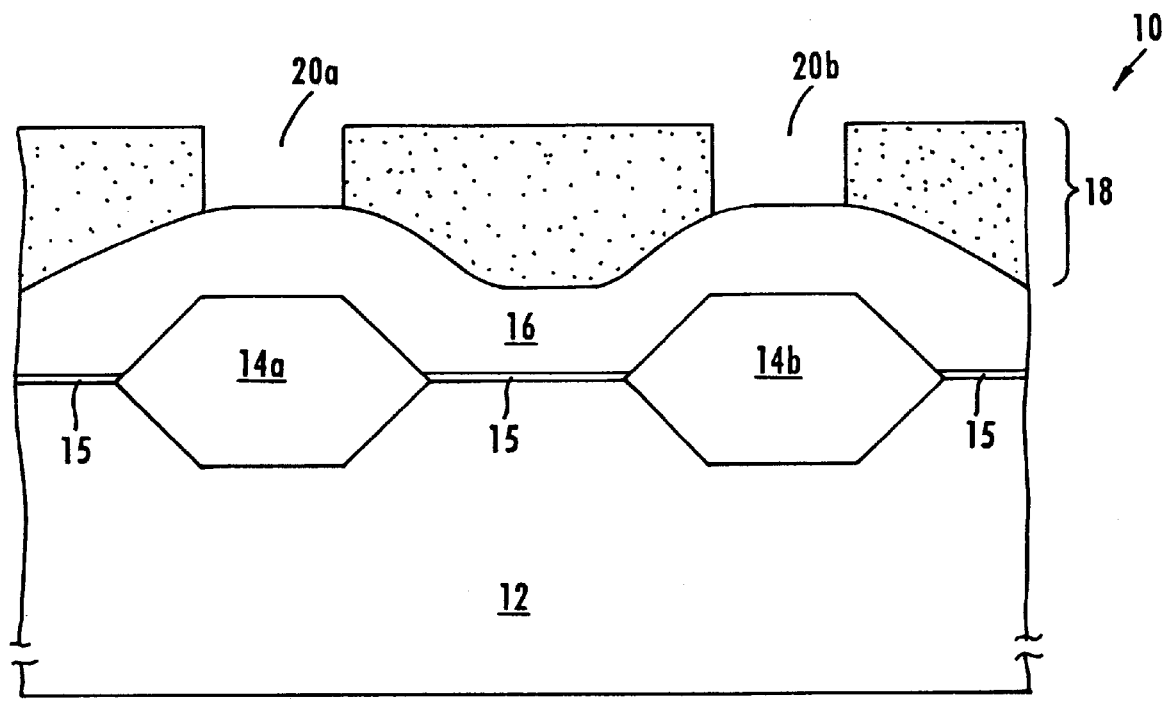
FIG. 2a depicts a cross-sectional view of a portion of a semiconductor device during the formation of a plurality of floating gates.

FIG. 2a depicts a portion 10 of a semiconductor device as viewed from a cross-sectional perspective through the word line (similar to FIG. 1b). Portion 10, in FIG. 2a, depicts the formation of floating gates 16a–c from at least one layer of polysilicon. As shown, a conformal polysilicon layer 16 has been formed over substrate 12, tunnel oxide 15, and field oxides 14a–b. Polysilicon layer 16 can be deposited, for example, using conventional deposition techniques, such as, chemical vapor deposition (CVD) or plasma enhanced CVD (PECVD) techniques. To pattern polysilicon layer 16 into floating gates 16a–16c (see FIG. 2b) a mask 18 is formed on polysilicon layer 16. Mask 18, which is typically a lithographic mask, includes openings 20a–20b that selectively expose portions of the underlying polysilicon layer 16. The formation of floating gates 16a–c is accomplished by employing anisotropic etching processes, such as, reactive ion etching (RIE) or plasma etching processes, to remove the exposed portions of polysilicon layer 16 through openings 20a–b. The etching process is configured to stop on field oxides 14a–b.

Figure 2B:
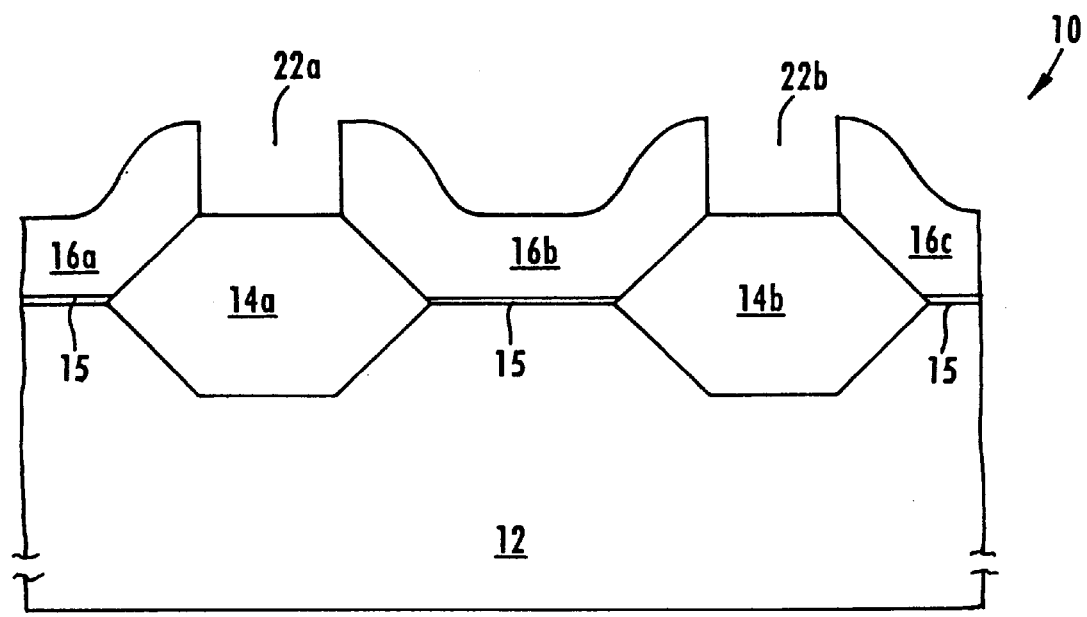
FIG. 2b depicts the portion of FIG. 2a following a selective etching process, which forms a plurality of floating gates.

In FIG. 2b, portion 10 has been etched and mask 18 has been stripped away, for example, using conventional stripping techniques, leaving floating gates 16a–c. The etching process creates spaces 22a and 22b. Spaces 22a–22b tend to be relatively narrow in width and are bordered by significant steps up to the top surface of floating gates 16a–c, as applicable. For example, in sub-micron flash memories, spaces 22a and 22b can be between about 1000 and about 4000 Angstroms in width. Floating gates 16a–c are typically about 600 to 1,100 Angstroms thick. Consequently, the critical dimension of spaces 22a–b represents a significantly severe topology over which the subsequent layers are formed (e.g., interpoly dielectric layer 24, control gate 26 and silicide layer 28).

Figure 2C:
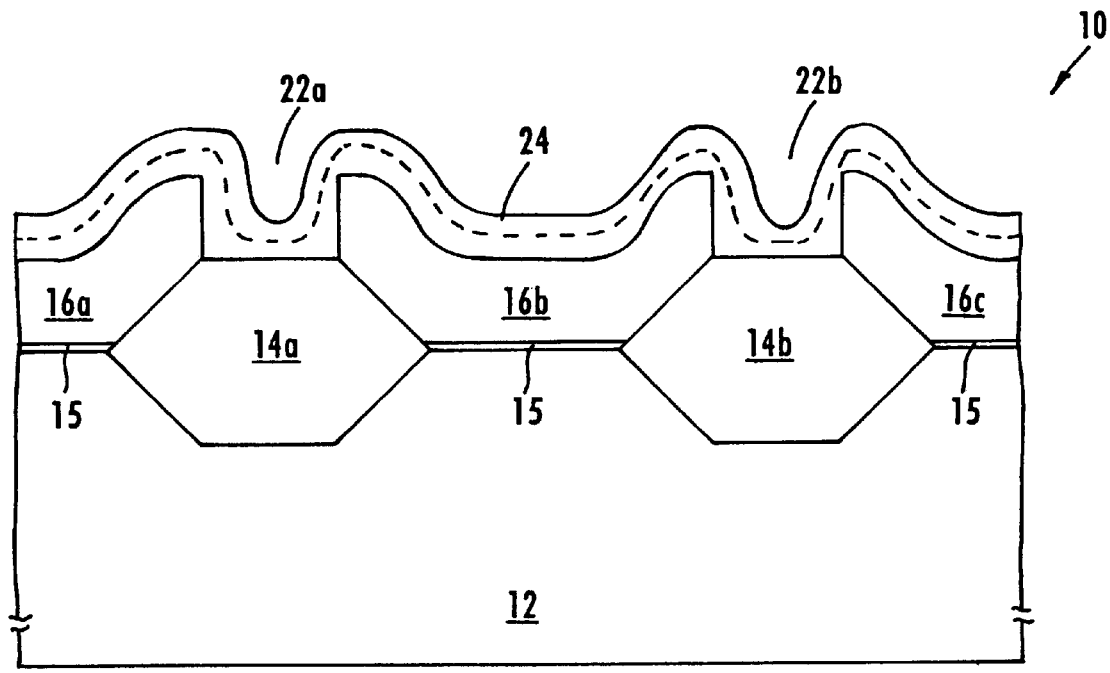
FIG. 2c depicts the portion of FIG. 2b following formation of an interpoly dielectric over the floating gates.

FIG. 2c depicts the portion 10 of FIG. 2b following deposition of interpoly dielectric layer 24 over floating gates 16a–c and within spaces 22a and 22b (see FIG. 2b). In certain preferred embodiments of the present invention, interpoly dielectric layer 24 is an ONO layer. An ONO layer can be formed, for example, by a three stage process in which a first film of silicon dioxide (e.g., about 40–75 Angstroms thick) is deposited or grown, followed by deposition of a second film of silicon nitride (e.g., about 50–150 Angstroms thick), and then a third film of silicon dioxide (e.g., about 40–75 Angstroms thick) is deposited or grown. The ONO layer provides a thin, highly-insulative dielectric layer that separates the floating gate 16 from the control gate 26, as depicted in FIG. 2d.

Figure 2D:
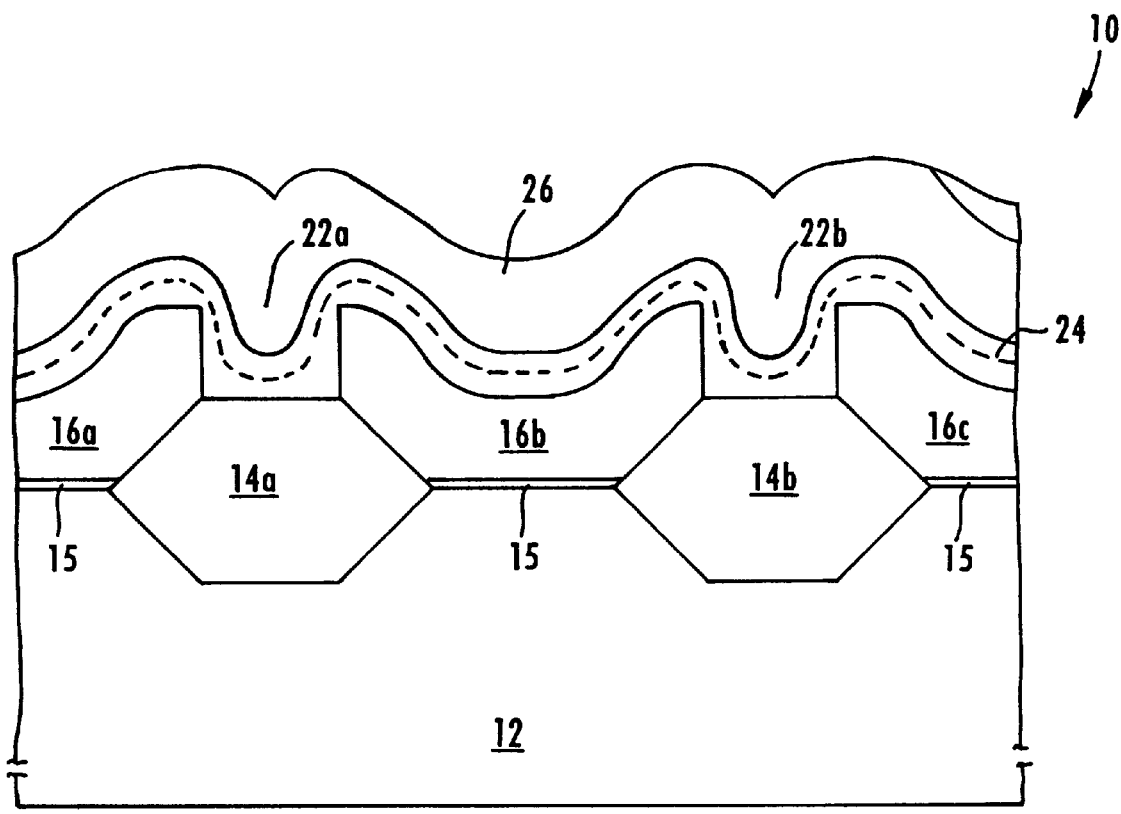
FIG. 2d depicts the portion of FIG. 2c following formation of a control gate polysilicon layer on the interpoly dielectric layer.
Figure 2E:
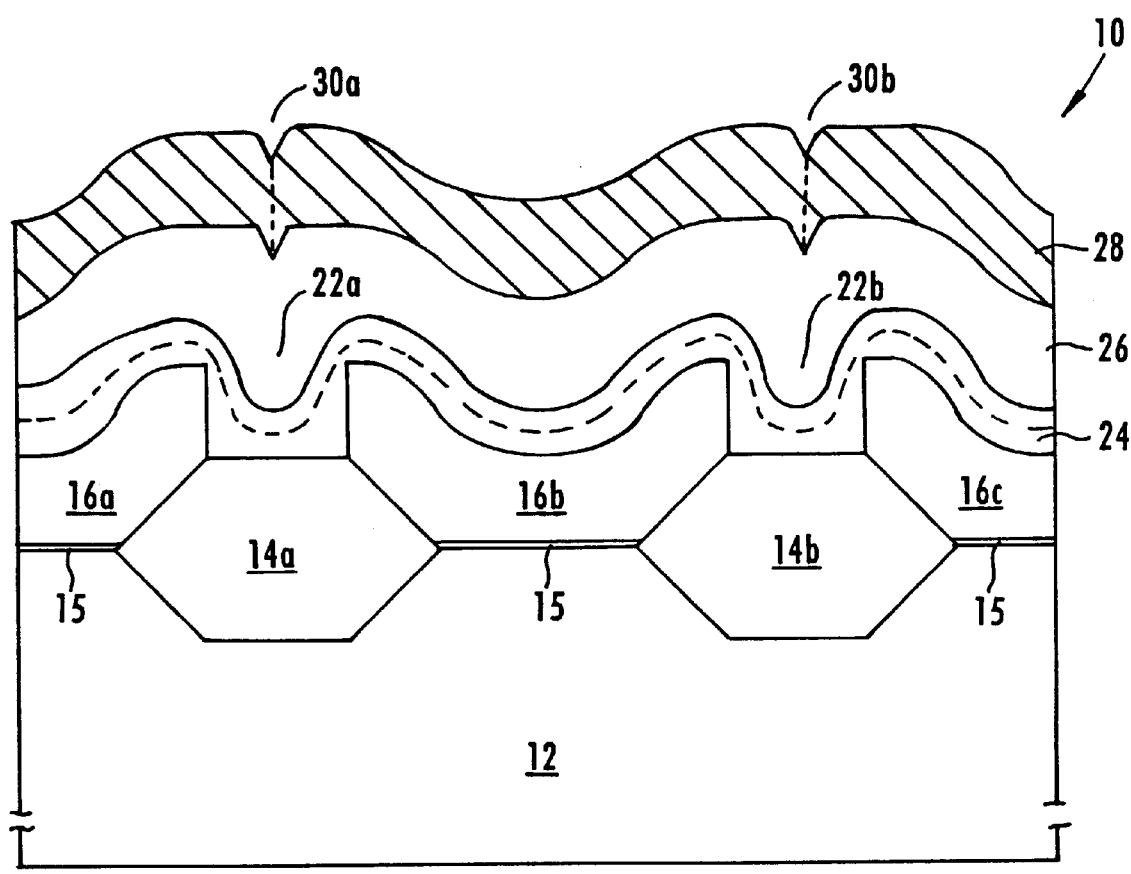
FIG. 2e depicts the portion of FIG. 2d following formation of a silicide layer on the control gate polysilicon layer and the formation of cracks in the silicide layer due to poor step coverage.

In FIG. 2d, the portion 10 of FIG. 2c has been further processed to include a conformal layer of polysilicon that is patterned to form the control gate 26. This polysilicon layer is deposited to a thickness of about 600–1,400 Angstroms using conventional deposition techniques, such as CVD and PECVD techniques. A silicide layer 28, for example tungsten silicide (e.g., $WSi_2$), is then formed on top of the polysilicon layer, as depicted in FIG. 2e. Although not visible from the word line cross-sectional perspective of FIG. 2d, the polysilicon layer (and silicide layer 28) is then selectively patterned using conventional polysilicon etching processes to form a control gate 26.

Silicide layer 28 increases the conductivity of the control gate 26 and is designed to carry a significant portion of the programming current during the programming of the memory cells. It has been found, however, that silicide layer 28 can develop cracks, such as cracks 30a–30b in FIG. 2e, during subsequent thermal processing of portion 10. Cracks 30a–30b can extend partially through silicide layer 28, or in some cases can extend all the way through silicide layer 28 to control gate 26.

The cracking of silicide layer 28 appears to be caused by a combination of the severe topology of the spaces 22a–b (see FIG. 2b) and the subsequent thermal processing which typically is required to complete the manufacturing process. For example, subsequent thermal processes can include a high temperature anneal or thermal oxidation process associated with subsequent manufacturing steps. Thus, silicide layer 28, when subjected to the high temperatures of the subsequent thermal processes, tends to crack above the severe topology of the underlying layers. Cracks, such as, for example cracks 30a and 30b in FIG. 2e, tend to increase the resistance in the control gate 26 and degrade the performance of the flash memory and/or damage the semiconductor device.

It has been found that the cracking of silicide layer 28 is more prominent when the spaces 22a–b between the floating gates 16a–c are less than approximately 4,000 Angstroms wide. In certain preferred embodiments of the present invention, spaces 22a–b are each between about 1,800 and about 3,500 Angstroms wide, and the thickness of each of the floating gates 16a–c is between about 600 and about 1,000 Angstroms. The resulting topology has been found to cause a significant amount of cracking of silicide layer 28 during subsequent thermal processing. By way of example, in certain situations the cracking of silicide layer 28 has caused the resistance of a word line to increase by at least about 100 times.

In accordance with certain embodiments of the present invention, the cracking of suicide layer 28 is substantially reduced, if not entirely eliminated, by reducing the aspect ratio of the spaces 22a–b by reshaping floating gates 16a–c. The reduced height floating gates 16a', 16b' and 16c' (shown in FIGS. 3b, 3c, and 4), reduce the severity of the topology, which in turn alters the shapes of the overlying layers deposited over and above spaces 22a–b. This allows for increased step coverage when forming control gate 26 and silicide layer 28.

Figure 3A:
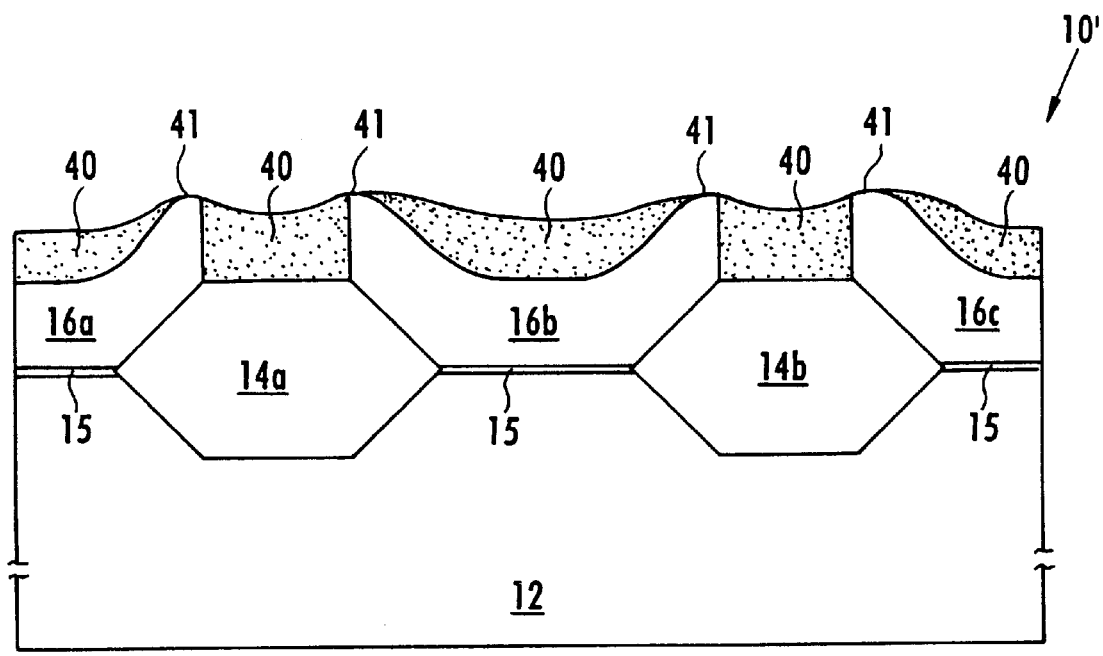
FIG. 3a depicts the portion of FIG. 2b following formation of a sacrificial spin-on layer on the floating gate structures, in accordance with certain embodiments of the present invention.

FIG. 3a depicts a portion 10', which is similar to portion 10 of FIG. 2b, following the formation of a sacrificial spin-on layer 40, in accordance with certain embodiments of the present invention. As shown, sacrificial spin-on layer 40 substantially covers floating gates 16a–c and exposed regions of field oxide 14a–b. Layer 40 is preferably a conventional spin-on layer of organic material, such as, for example, a photoresist material and/or bottom anti-reflective coating material containing polymers and/or polymides. In accordance with still other embodiments layer 40 can also include a conventional spin-on glass (SOG) material.

Layer 40 is configured to be a sacrificial layer that allows portions of floating gates 16a–c to be selectively removed. In particular, layer 40 covers and protects the lower lying portions of floating gates 16a–c during a subsequent etch back planarization process. During the subsequent etch back planarization process, exposed surfaces of portion 10' are subjected to an etching plasma, for example, and the higher regions 41 of floating gates 16a–c, which are not covered and/or protected by layer 40, are etched away. The etch back planarization process can be accomplished by employing conventional plasma etching or reactive ion etching (RIE) techniques. The etching plasma preferably exhibits a relatively high etch rate selectivity with respect to the etching rate of the polysilicon of floating gates 16a–c versus the etching rate of the material in layer 40. As a result of the etch back planarization process the thickness of the floating gates 16a–c near spaces 22a–b is selectively reduced.

Figure 3B:
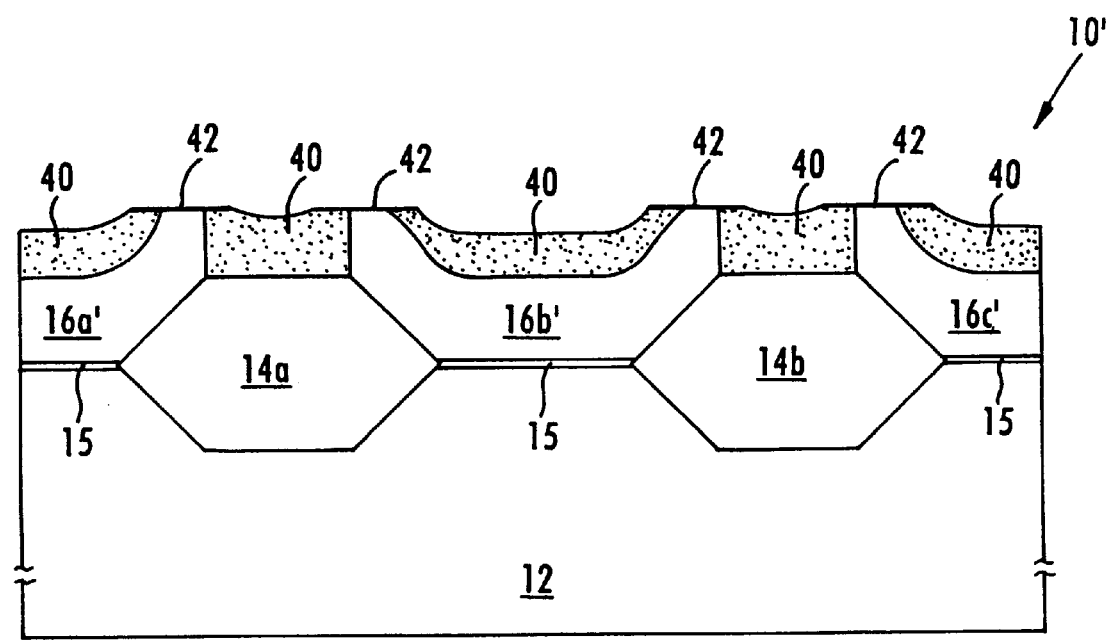
FIG. 3b depicts the portion of FIG. 3a following an etch back planarization process in which higher portions of the floating gate structure have been removed to reduce the steps of the floating gates, in accordance with certain embodiments of the present invention.

FIG. 3b depicts the portion of FIG. 3a following an etch back planarization process that leaves reduced height floating gates 16a', 16b' and 16c'. The etch back planarization process selectively removed higher regions 41, thereby leaving reshaped regions 42. Consequently, the corresponding aspect ratio of spaces 22a–b is proportionally reduced due to the reduced thickness ("height") of reshaped regions 42.

By way of example, in certain exemplary embodiments the initial thickness of floating gates 16a–c, including higher regions 41, is between about 600 and about 1100 Angstroms.

Following the etch back planarization process, the thickness of reshaped regions 42 is between about 400 and about 800 Angstroms, and more preferably less than about 600 Angstroms. Thus, in certain exemplary embodiments, reduced height floating gate 16b' has a thickness less than about 600 Angstroms near reshaped regions 42 and a full thickness of between about 900 Angstroms (i.e., the original thickness of 16a–c) over tunnel oxide 15.

Figure 3C:
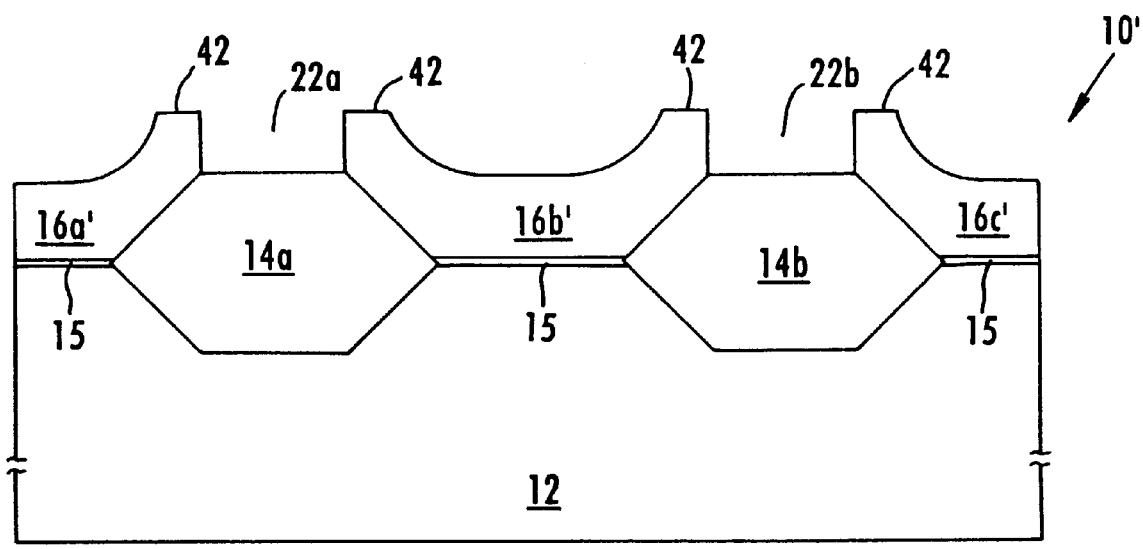
FIG. 3c depicts the portion of FIG. 3b following removal of the sacrificial spin-on layer, in accordance with certain embodiments of the present invention.

Next, as depicted in FIG. 3c, all of the remaining portions of sacrificial spin-on layer 40 have been removed to reveal reduced height floating gates 16a', 16b' and 16c'. Spin-on layer 40 is removed using conventional stripping or ashing techniques.

Figure 4:
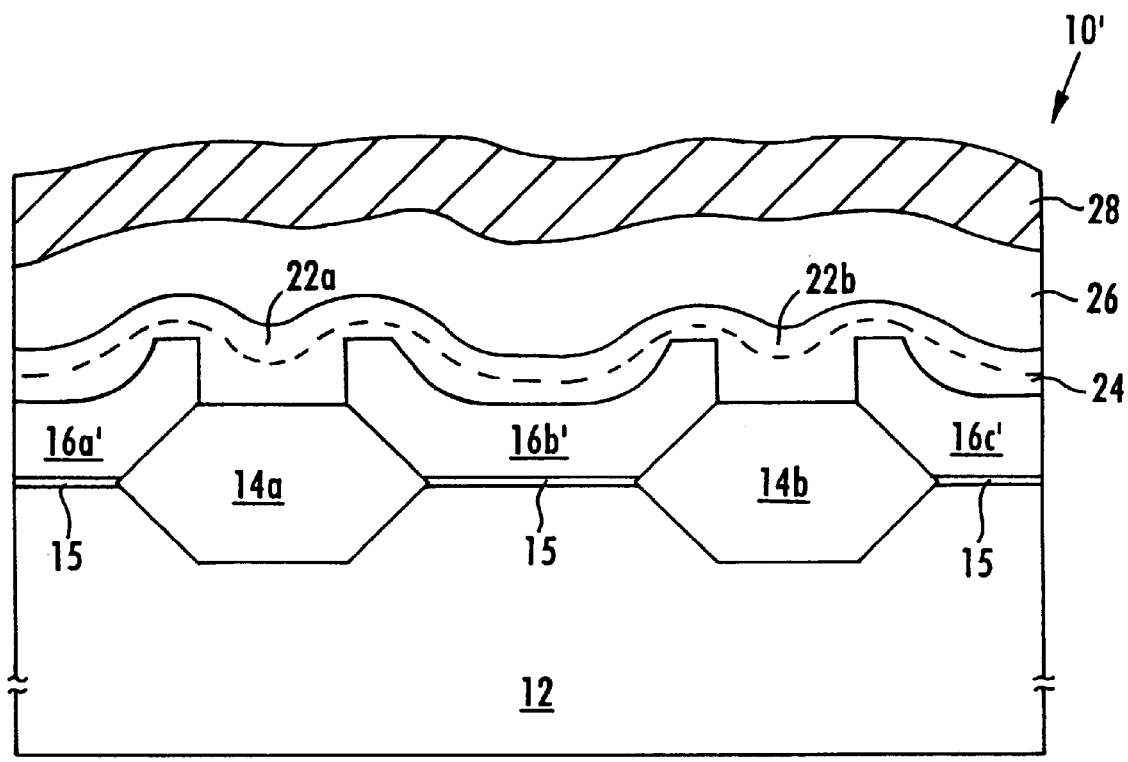
FIG. 4 depicts the portion of FIG. 3c following formation of an interpoly dielectric layer, control gate polysilicon layer and silicide layer, in accordance with certain embodiments of the present invention.

FIG. 4 depicts portion 10' following the subsequent formation of interpoly dielectric layer 24, control gate polysilicon layer 26 and silicide layer 28. As seen in FIG. 4, the silicide layer 28 does not exhibit the cracks 30a–b over the isolating regions (i.e. the field oxide regions 14a–b). Since cracks in the silicide layer 28 are significantly reduced or substantially eliminated, the resistance of the control gate arrangement is not deleteriously increased to any significant extent.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A semiconductor device comprising:
    a substrate having a top surface;
    at least two isolating regions formed at least partially within the substrate, near the top surface of the substrate and separated from each other by an isolated region; and
    a floating gate over a tunnel oxide and a portion of at least one of the isolating regions, wherein the floating gate has a first thickness measured between a lowest point on its top surface and a top surface of the tunnel oxide and a second thickness measured at its outer edge over the isolating region, and the first thickness is greater than the second thickness.

2. The semiconductor device as recited in claim 1, wherein at least one of the isolating regions comprises silicon dioxide.

3. The semiconductor device as recited in claim 1, further comprising:
    a dielectric layer conformally formed on the reduced height floating gate and at least a portion of each of the two isolating regions;
    a control gate formed on at least a portion of the dielectric layer and at least partially located directly over at least a portion of the reduced height floating gate; and
    a silicide formed on at least a portion of the control gate.

4. The semiconductor device as recited in claim 1, wherein the reduced height floating gate comprises polysilicon.

5. The semiconductor device as recited in claim 4, wherein the silicide comprises tungsten.

6. The semiconductor device as recited in claim 1, wherein the dielectric layer comprises at least one dielectric material selected from a group of silicon dioxide and silicon nitride.

7. The semiconductor device as recited in claim 1, wherein the first thickness is more than about 600 Angstroms and the second thickness is less than about 600 Angstroms.

8. A semiconductor device comprising:
    a substrate having a top surface;
    at least two isolating regions formed at least partially within the substrate, near the top surface of the substrate and separated from each other by an isolated region; and
    a reduced floating gate over a tunnel oxide and a portion of at least one of the isolating regions, wherein the floating gate has a first thickness between a lowest point on its top surface and a top surface of the tunnel oxide and a second thickness at its outer edge over the isolating region, and the first thickness is greater than the second thickness, wherein the device is manufactured by a method, the method comprising:
    forming an initial floating gate over the substrate and a portion of at least one of the isolating regions; and
    reducing the height of at least a portion of the initial floating gate to form the reduced height floating gate that has the first thickness and the second thickness.

9. The device as recited in claim 8, wherein the step of reducing the height of at least a portion of the initial floating gate to form the reduced height floating gate includes:
    forming a sacrificial layer on at least a portion of the initial floating gate; and
    etching back portions of the sacrificial layer and portions of the initial floating gate.

* * * * *